United States Patent [19]

Schilling et al.

[11] Patent Number: 4,871,977

[45] Date of Patent: Oct. 3, 1989

[54] MONOLITHIC INTEGRATED WIDEBAND POWER AMPLIFIER

[75] Inventors: Harald Schilling, Freiburg; Bernd Novotny, Kiel, both of Fed. Rep. of Germany

[73] Assignee: Deutsche ITT Industries GmbH, Freiburg, Fed. Rep. of Germany

[21] Appl. No.: 265,198

[22] Filed: Oct. 31, 1988

[30] Foreign Application Priority Data

Nov. 20, 1987 [EP] European Pat. Off. ........ 87117136.9

[51] Int. Cl.$^4$ .......................... H03F 3/30; H03F 3/45; H01L 29/72
[52] U.S. Cl. .................................... 330/255; 330/257; 330/273; 330/307; 357/34; 357/36; 357/45
[58] Field of Search ............... 330/255, 257, 262, 273, 330/274, 307; 357/35, 36, 34, 45

[56] References Cited

U.S. PATENT DOCUMENTS 4,451,799 5/1984 Fujita ................................... 330/255
4,652,900 3/1987 Hashimoto ............................. 357/34

OTHER PUBLICATIONS

IEEE International Solid-State Circuits Conference, 27 (1984) San Francisco, Feb. 22-24, Conference 31, N.Y., U.S.A., W. F. Davis et al.: "A Monolithic P-Channel JFET Quad Operational Amplifier".

Primary Examiner—James B. Mullins
Attorney, Agent, or Firm—Thomas L. Peterson

[57] ABSTRACT

A monolithic integrated wideband power amplifier circuit has a push-pull output stage, a driver stage, a difference stage which receives an input voltage signal and provides a difference signal, and the improvement of an operating point setter which receives the difference signal and controls the operating point of the circuit through a settable resistor. The setting of the operating point is independent of the gain of the output stage, and both are independent of temperature. The bipolar NPN transistors of the push-pull output stage consists of parallel-connected subtransistors which are arranged in the integrated circuit layout according to their characteristics and specific use, so as to minimize parasitic capacitances and resistances and to keep the upper cutoff frequency as high as possible.

17 Claims, 6 Drawing Sheets

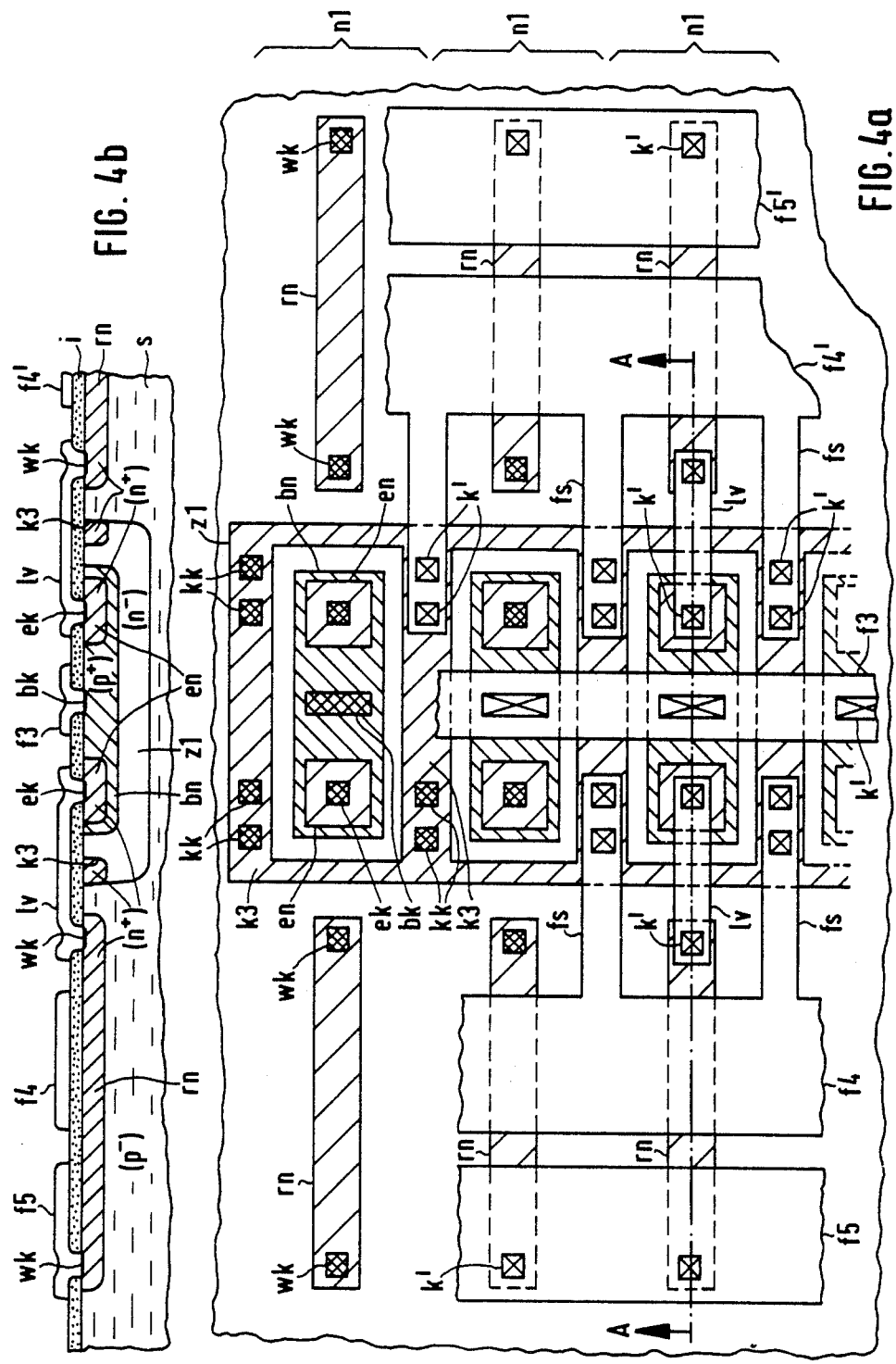

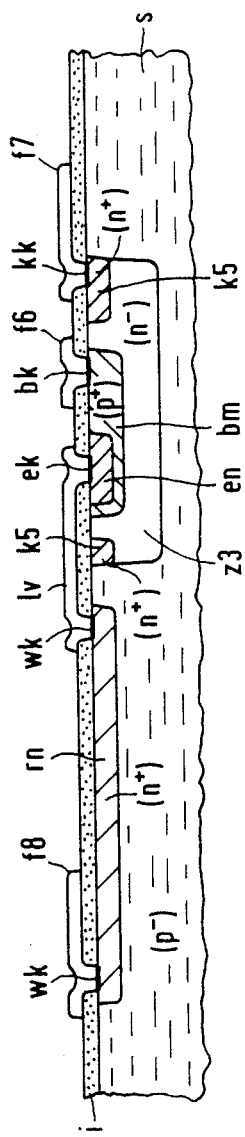
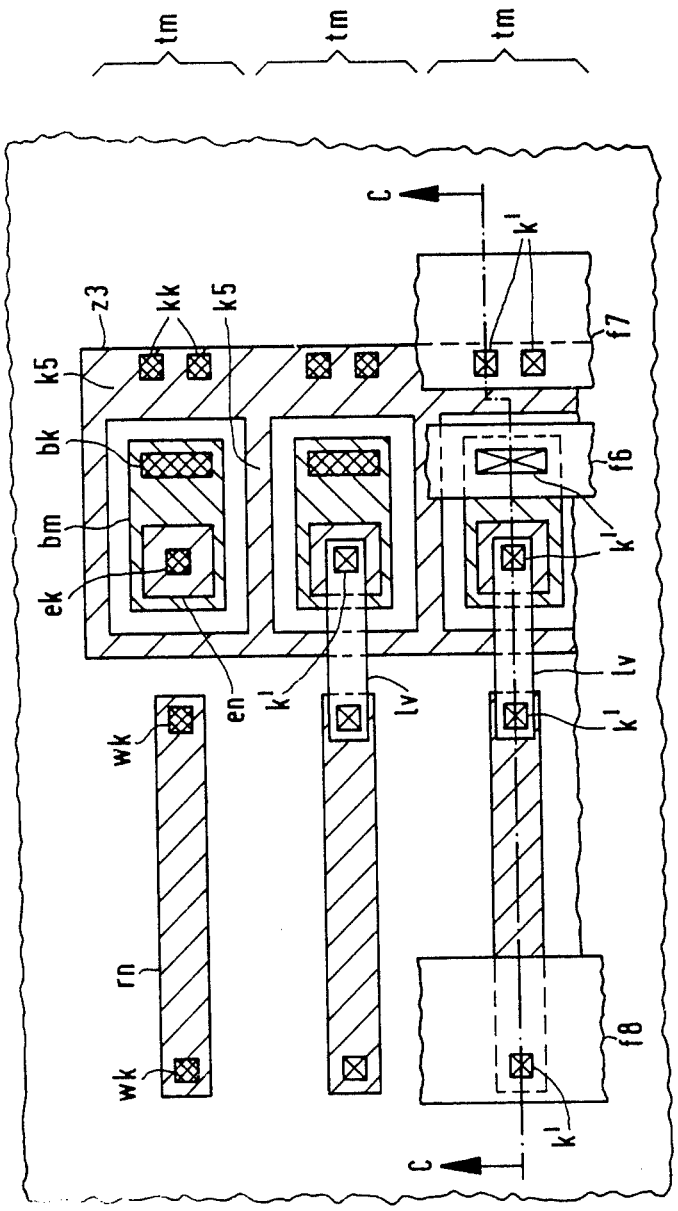

MONOLITHIC INTEGRATED WIDEBAND POWER AMPLIFIER

FIELD OF INVENTION

The present invention relates to a monolithic integrated wideband power amplifier of the type having a push-pull output stage including too bipolar transistors connected in series in the same direction, a driver stage for driving the output stage, and a difference stage at the input end which receives an input voltage signal and provides an output signal to the driver stage and output transistors.

BACKGROUND OF INVENTION

A conventional wideband power amplifier is described in an RCA manual entitled "RCA Linear Integrated Circuits", Technical Series IC-41, 1967, pages 263 to 266, and is shown in the circuit schematic diagram of FIG. 7. The power amplifier as shown has a difference stage (labelled "first stage") which receives an input voltage signal applied across two input terminals. The output signals of the collectors of transistors Q3 and Q4 of the difference stage are provided as inputs to a driver stage (labelled "second stage"), and a driver signal is further provided to the base of a driver transistor Q14.

The driver stage controls the operating point and overall gain of an output stage (labelled "third stage") having two bipolar transistors Q17 and Q18 connected in series in the same direction. Transistor Q17 has its collector connected to one terminal of a supply-voltage source and its emitter connected to the collector of transistor Q18, and the latter transistor has its emitter connected to the other terminal of the supply-voltage source. transistor Q18 is the negative output transistor.

In the conventional power amplifier shown in FIG. 7, the transistor Q14 of the driver stage drives inverting transistor Q15 and output transistor Q18 in parallel. The transistor Q15 has its emitter coupled to the other terminal of the supply-voltage source, and its base connected to the base of the output transistor Q18 over a common base lead. The collector of transistor Q15 is connected through a resistor R7 to the one terminal of the supply-voltage source, and is applied to the base of transistor Q16, which is in common collector configuration and provides its emitter output to the base of output transistor Q17. An output voltage is obtained from the junction point between the two series-connected output transistors Q17 and Q18. Negative feedback from the output stage to the input of the transistor Q14 is supplied by a resistor R15 which is connected to the junction point between the two output transistors Q17 and Q18.

The conventional power amplifier described above is disadvantageous in that it has a high open-loop gain. The desired loop gain is achieved by providing external negative feedback from the output stage to the input of the driver stage. Furthermore, a change in load resistance at the driver stage transistor changes not only the current through the two output stage transistors but also the output stage gain.

SUMMARY OF INVENTION

In order to overcome the disadvantages of the prior art power amplifier circuit arrangement, it is a principal object of the present invention to provide an improved circuit arrangement in which the operating point of the output stage is settable independently of the overall gain and without negative feedback. It is a further object that signal distortions are kept to a minimum even at very high frequencies and capacitive loads.

In accordance with the present invention, a wideband power amplifier circuit comprises: an output stage including first and second transistors connected in series in the same direction with a junction point provided as an output node in series between them; a driver stage including a third transistor having its base connected by a common base lead to the base of the second transistor; a difference stage having input terminals to which an input voltage signal is applied and which provides an output difference signal; and the improvement of an operating point setter which is settable independently of the gain of the output stage and includes an intermediate node receiving the difference signal from the difference stage, a setting resistor connected to the intermediate node, a fourth transistor having its collector connected to the intermediate node in series with the setting resistor and its base connected to the common base lead, and a load-reducing transistor having its base connected to the intermediate node and its emitter connected to the common base lead.

The difference stage outputs the difference signal as a current signal whose polarity and magnitude are directly dependent on the input voltage signal The difference signal is supplied to the intermediate node, which serves as an input to the overall push-pull output stage. The second, third, and fourth transistors have their emitters coupled to a supply line of a supply-voltage source through respective negative-feedback resistors configured so that the three transistors and associated resistors and the load-reducing transistor constitute a triple constant-current sink.

If the difference signal current is zero, only the setting current through the setting resistor determines the the quiescent output voltage at the output node. The quiescent output voltage can thus be set by changing the value of the setting resistor. The voltage drop across the operating-point setter, and consequently the quiescent voltage at the output node, is determined by the resistive voltage drop across the setting resistor Consequently, the ratio of the quiescent voltage to the supply voltage is independent of temperature, and also independent of the supply voltage. The output voltage at the output node is proportional to the input voltage signal applied to the input terminals, so that the swing of the output voltage is also independent of temperature.

The wideband power amplifier according to the invention is preferably used as a line driver in digital systems for clock or data signals which are transferred over capacitively loaded lines. These lines can be clock or data lines within or between monolithic integrated circuits. The principal advantages of the wideband power amplifier according to the invention are that the operating point and the gain are set independently of each other, and that the operating point and output voltage are independent of temperature changes

BRIEF DESCRIPTION OF DRAWINGS

The above objects and advantages and further features of tee invention are described in detail below in conjunction with the drawings, of which:

FIGS. 4a and 4b show a schematic layout in plan view and in sectional view, respectively, of transistors and negative-feedback resistors connected to the emitter leads thereof for the circuit of FIG. 1;

FIGS. 6a and 6b show a schematic layout in plan view and in sectional view, respectively, of a further arrangement of transistors and negative-feedback resistors.

DETAILED DESCRIPTION OF INVENTION

Figure 1:
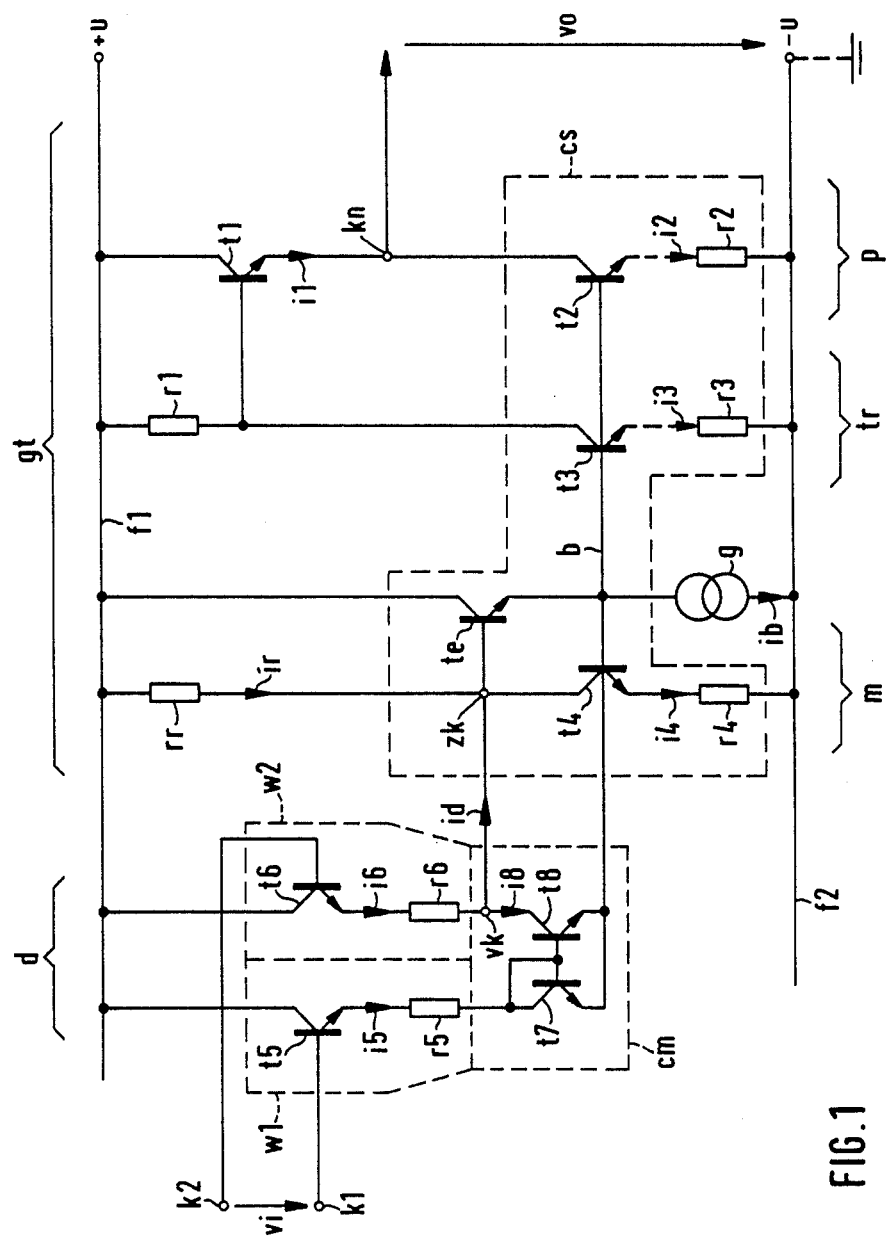
FIG. 1 is a circuit diagram of an embodiment of the wideband power amplifier according to the invention.

FIG. 1 shows an embodiment of a wideband power amplifier circuit according to the invention. A first supply line f1 is connected to one terminal +u of a supply-voltage source, and a second supply line f2, which may be grounded, is connected to the other terminal −u. The power amplifier circuit generally includes a difference stage d and a push-pull output stage designated as a whole by gt. The push-pull output stage has an output stage p, a driver stage tr for driving the latter, and an operating-point setter m for independently setting the quiescent operating point of the series-connected transistors of the output stage p.

The output stage p contains a first transistor t1 and a second transistor t2 whose collector emitter paths are connected in series in the same direction, and have a junction point kn between them which serves as the output node from which an output voltage vo is obtained. In the embodiment shown, the output transistors are bipolar NPN transistors. The first transistor t1 has its collector connected to the supply line f1 connected to the +u terminal of the supply-voltage source, and the emitter of the second transistor t2 is coupled to the other supply line f2.

The driver stage tr contains a third transistor t3 having its emitter coupled to the supply line f2, its base conductively connected to the base of the second transistor t2 over a common base lead b, and its collector connected through a resistor r1 to the supply line f1 and directly to the base of the first transistor t1 of the output stage. The driver stage tr is controlled by an output signal from the difference stage d, which is transmitted on the common base lead b to the second and third transistors t2, t3 as described further herein. To drive the base of the first transistor t1, the output signal from the difference stage is provided through the collector of the third transistor t3 and is inverted in phase.

The operating-point setter m includes a setting resistor rr, a fourth transistor t4, and a load-reducing transistor te to set the operating point of the push-pull output stage gt by means of setting the quiescent current flowing through the two output stage transistors and the quiescent output voltage The quiescent voltage may be, for example, the voltage mean between the supply voltages +u and −u.

The input to the wideband power amplifier is provided to the first and second input terminals k1, k2 to which the input voltage vi is applied as a difference voltage. The difference voltage comes, for example, from an emitter-coupled logic (ECL) stage and has a swing of, e.g., +/+0.4 V. The potential of either of the two input terminals k1, k2 may be equal to +u of the supply-voltage source. The input terminals k1, k2 provides the input signals to the difference stage d, which outputs a difference current id whose polarity and magnitude are directly dependent on the input voltage vi.

The difference current id is supplied to the intermediate node zk, which serves as an input to the overall push-pull output stage gt. The latter consists of the operating-point setter m, which contains the resistor rr for setting the quiescent output voltage, the driver stage tr, and the output stage p, which contains the first and second transistors t1, t2. The emitter of the first transistor t1 and the collector of the second transistor t2 are connected to the output node kn.

The first transistor t1 is an emitter follower whose collector is connected directly to the first supply line f1, and whose base is connected to the first supply line f1 through the first resistor r1. The latter is also the load resistor of the driver transistor, namely the third transistor t3, whose base is connected to the base of the second transistor t2 by the common base lead b.

The emitter of the second transistor t2 is connected through a second resistor r2, and that of the third transistor t3 through a third resistor r3, to the second supply line f2. These two resistors thus act as negative-feedback resistors. Also connected to the common base lead b is the base of the fourth transistor t4, which forms part of the operating-point setter m. The emitter of the fourth transistor t4 is connected to the second supply line f2 through a fourth resistor r4 as a negative-feedback resistor. The collector of the fourth transistor is connected to the intermediate node zk, which is in turn connected to the first supply line f1 through the setting resistor rr, and to the base of the load-reducing resistor te, whose emitter is connected to the common base lead b and whose collector is connected to the first supply line f1.

The value of each of the three negative-feedback emitter resistors r2, r3, r4 is inversely proportional to the emitter area of the associated transistor t2, t3, t4. These six circuit elements and the load-reducing transistor te for the triple constant-current sink cs. The input of the latter is the intermediate node zk, which is supplied with the difference current id, and, through the setting resistor rr, with the setting current ir. In accordance with a desired ratio for the emitter areas, the emitter current i2 of the second transistor is greater than the emitter current i3 of the third transistor t3, which in turn is greater than the emitter current i4 of the fourth transistor t4. For example, with an emitter area ratio of 20:10:1, the ratio of the emitter currents i2, i3, i4 is also 20:10:1.

If the difference current id is zero, only the setting current ir determines the voltage drop across the first resistor r1, and, thus, the quiescent output voltage at the output node kn. The common quiescent current of the first and second transistors is determined by the emitter current i2 of the second transistor. The quiescent output voltage can thus be set by changing the value of the setting resistor rr, which can be done, for example, by shifting the resistor contact by means of a changed in-contact mask. The quiescent output voltage can be set to one-half the supply voltage, for example. In this specific case, it is completely independent of temperature.

The temperature compensation of the quiescent voltage follows from the fact that the voltage across the setting resistor rr, which produces the setting current ir, is equal to the supply voltage less the two base-to-emitter of the load-reducing transistor te and the fourth transistor t4. The driver current i3, which is strictly proportional to the setting current ir, determines the quiescent output voltage and produces across the first resistor r1 a voltage drop which is only half as large as that across the setting resistor rr. The base-to-emitter voltage of the first transistor t1 adds to the voltage drop across the first resistor r1.

The total voltage drop across the operating-point setter thus includes a defined resistive voltage drop (across rr) and the forward voltages of two diode paths. The quiescent voltage at the output node, which is equal to one-half the supply voltage, includes one-half the resistive voltage drop (across rr) and the forward voltage of one diode path. Consequently, the ratio of the quiescent voltage to the supply voltage is independent of temperature, and also independent of the supply voltage. If a value different from one-half the supply voltage is chosen for the quiescent voltage, the compensation is no longer ideal, but still good.

The voltage drop across the three negative-feedback emitter resistors r2, r3, r4 is negligible for these considerations regarding temperature dependence, because it is only 50 mV, for example. However, this value is fully sufficient for balancing the triple constant-current sink cs, since the three transistors t2, t3, t4 are balanced essentially by precise layout arrangement, particularly of their base and emitter areas.

The difference stage d is the subcircuit which derives the difference current id from the input voltage vi. The difference current id is superimposed on the setting current ir at the intermediate node zk and, thus, represents the signal component. The first input terminal k1 is connected to a first voltage-to-current converter w1, whose output is fed to an input of the current mirror cm. The second input terminal k2 is connected to the input of a second voltage-to-current converter w2, whose output is connected to an output of the current mirror cm via the branch point vk, which delivers the difference current id.

At the input end, the first voltage-to-current converter w1 contains a first impedance converter in the form of a fifth transistor t5, which is connected as an emitter follower. The emitter of the fifth transistor t5 is connected via a fifth resistor r5 to the low-resistance input of the current mirror cm, i.e., to a direct connection between the base and collector of a seventh transistor t7, which also has the base of an eighth transistor t8 connected to it. The emitters of the seventh and eighth transistors t7, t8 are connected to the common base lead b of the triple constant-current sink cs. The voltage drop across the fifth resistor r5 produces a first reference current i5, which is mirrored, appearing as the collector current i8 of the eighth transistor t8.

The second voltage-to-current converter w2 is identical in construction to the first and contains at the input end a second impedance converter in the form of a sixth transistor t6, which is connected as an emitter follower. The emitter of this transistor t6 is connected to the branch point vk via a sixth resistor r6. As the branch point vk is connected via the intermediate node zk to the base-emitter path of the load-reducing transistor te, its potential with respect to the low end of the current mirror cm is fixed. Thus, the voltage drop across the sixth resistor r6 produces a second reference current i6, which flows into the branch point vk. On the other hand, the latter is loaded by the Output current i8 of the current mirror cm, so that a current difference is formed If the first and second reference currents i5, i6 are not equal to one another, the excess current will flow as the difference current id into the intermediate node zk and will be led off therefrom.

The intensity of the difference current id is thus dependent both on the input voltage vi and on the values of the fifth and sixth resistors r5, r6. By mask-trimming these resistors, e.g., by shifting the contact openings, in a manner similar to that described above for the setting resistor rr, these two equal value resistors can be changed in value together. Thus, the ratio of the difference current id to the input voltage vi can be adjusted in a simple manner.

The sum of the two reference currents i5, i6 flows into the common base lead b and must be passed from there to the other terminal −u of the supply-voltage source. This is done by means of the load current ib, with which the common base lead b is loaded via a resistor or a constant-current sink g. The intensity of the load current ib is preferably chosen so that the load-reducing transistor te will also be loaded, namely with a current which is approximately equal to the mean value of the first reference current i5. If the current densities in the load-reducing transistor te and the seventh transistor t7 are equal, the input potential of the current mirror cm is equal to the potential at the intermediate node zk.

Figure 2:
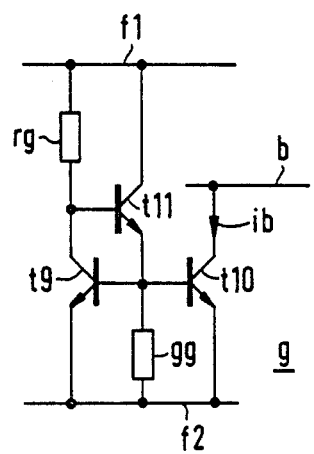
FIG. 2 is a circuit diagram of a constant-current sink arrangement in the circuit of FIG. 1.

FIG. 2 shows an embodiment of the constant-current sink g for generating the load current ib. The constant-current sink g has, for example, a current mirror formed by ninth and tenth transistors t9, t10 and a load-reducing transistor t11 whose base-emitter path is connected in parallel with the collector-base path of the ninth transistor t9. The input current of this current mirror is determined by a resistor rg between the first supply line f1 and the collector of the ninth transistor t9, which forms the input of the current mirror together with the eleventh transistor t11. The emitters of the ninth and tenth transistors t9, t10 are both connected to the second supply line f2, while the collector of the tenth transistor t10 is connected to the common base lead b of the triple constant-current sink cs and draws the load current ib therefrom To sufficiently load the load-reducing transistor t11, whose collector is connected to the first supply line f1, a load resistor gg is connected between the emitter of the transistor t11 and the second supply line f2.

As in the case of the quiescent output voltage, the output signal amplitude is independent of temperature. The difference current id depends only on the voltage difference vi between the first and second input terminals k1, k2, the values of the resistors r5, r6, and the temperature coefficients of the latter It is justified to assume that the base-to-emitter voltages of the transistors t5, t6 are equal to one another regardless of temperature, for the current densities in these transistors are nearly equal because the maximum value of the input voltage vi is about 500 mV. The difference current id thus has a temperature coefficient which is reciprocal to that of the fifth or sixth resistors r5, r6, and also reciprocal to that of the first resistor r1.

The swing of the output voltage vo is exactly equal to the voltage drop across the first resistor r1, and since the three integrated resistors r1, r5, r6 have the same temperature coefficient, the voltage drop across the first resistor r1 is exactly proportional to the difference between the voltages at the two input terminals k1, k2. Thus, the swing of the output voltage vo is independent of temperature. For the same reasons, the supply voltage or the common direct voltage at the input terminals has no influence on the swing of the output voltage vo if limiting effects or extreme operating conditions are avoided.

If such wideband power amplifiers are used for processing high-frequency signals, it is necessary not only to design the circuit itself from a high-frequency viewpoint but also to take the high-frequency performance into account for monolithic integration, particularly in the layout of the components. The circuit of FIG. 1, for example, contains exclusively bipolar PN transistors because the transit frequency of such transistors is considerably higher than that of lateral PNP transistors. Furthermore, the current densities of the transistors must be chosen so that the cutoff frequency lies in the range of its maximum value. The necessary currents, especially the large output currents of the output stage p, are made possible by connecting subtransistors in parallel, so that the current density of the individual transistor will always lie in the range of the optimum.

Both the circuit and its layout must be designed with a view to keeping parasitic capacitances to a minimum, with particular attention paid to the strong influence of the collector-base capacitance of the transistor, i.e., the Miller capacitance. Therefore, one characteristic of a good layout is as small a common base-collector area as possible because of the Miller capacitance, and as small a collector as possible because of the capacitive coupling between the collector and the substrate.

The transistors' input capacitances, i.e., the base-emitter capacitances, must also be kept as low as possible. However, limits are imposed on reduction of the emitter area because excessive current densities reduce the cutoff frequency and degenerate the transistor's electrical properties.

Another important factor is the forming of contacts with the various regions. In the case of small contacts, the contact resistance increases and forms with the parasitic capacitances a low-pass filter which reduces the upper cutoff frequency. Finally, the influence of the bulk resistances of the individual regions, particularly the n− conductivity type collector region, must be taken into account.

Since crossovers are commonly implemented with low impedance regions whose bulk resistances are not negligible and, together with parasitic capacitances, result in an undesired low-pass response, such regions should be avoided as far as possible If connections are made by indirect paths, their parasitic capacitances must also be taken into account.

All of the above considerations are taken into account in the preferred IC layout which is described below with reference to FIGS. 3-6. To form the subtransistors, an n− type collector region contains a low resistance n+ contact region which surrounds the base as far as possible and contains the collector contacts, so that the bulk resistance for the charge carriers injected into the collector region can be kept low. To reduce the, base-collector capacitance, a dual-emitter structure is provided in which two base regions are so combined that a single base contact is sufficient for their energization. The above-mentioned subtransistors are connected in parallel by directly or indirectly connecting the corresponding contacts in parallel.

Figure 3A:
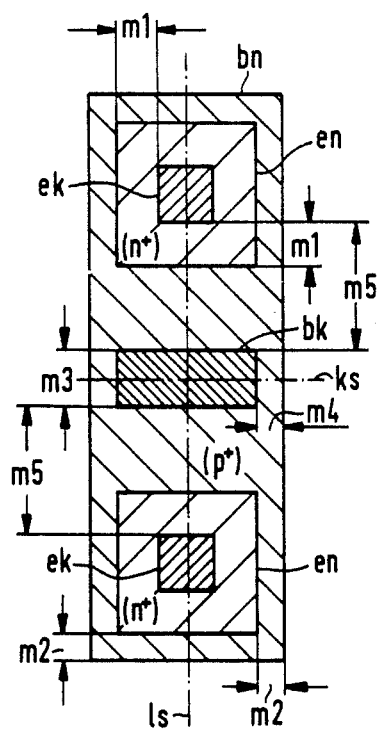
FIGS. 3a and 3b show two integrated circuit layouts of the base regions of transistors for the circuit of FIG. 1.

FIG. 3a shows schematically the layout of a base subregion bn of a subtransistor which contains a dual-emitter structure. The base subregion bn is formed as a symmetrical rectangular structure with a long axis of symmetry ls and a short axis of symmetry ks. Located within the base subregion bn at each of the two narrow side ends thereof is a square emitter subregion en, which is embedded in but not covered by the base subregion bn. In the middle of the area of the emitter subregion en, there is an emitter contact ek, which is designed as a minimum contact, i.e., its contact resistance is just low enough, but its distance from the outer edge of the emitter subregion en does not exceed a minimum distance m1. The distance between the outer edge of the emitter subregion en and the adjacent outer edge of the base subregion bn is equal to a second minimum distance m2.

Located within the base subregion bn, at the intersection of the short and long axes of symmetry ks, ls, is a base contact bk which has a rectangular shape. Its longitudinal direction is the direction of the short axis of symmetry ks, and its width is equal to a third minimum distance m3. The base contact is made as long as possible in the direction of the short axis of symmetry, but the distances between its narrow side edges and the adjacent outer edges of the base subregion bn are not less than a fourth minimum distance m4. The size of the base subregion bn is determined by the factor that the distances between the two emitter contacts ek and the adjacent edges of the base contact bk must not be less than a fifth minimum distance m5.

The individual minimum distances are selected as necessary to allow for oversizing or undersizing which may result in the process steps, tolerances for mask alignment errors, mask distortions or process-induced errors, and the necessary dielectric strength of the individual regions.

The emitter contact ek is closely hatched from the upper right to the lower left. The base contact bk is closely hatched from the upper left to the lower right. The conductivity type of the relatively low-resistance p+ base material is indicated in the base subregion bn by (p+). Similarly, the relatively low-resistance n+ material of the emitter subregion en is indicated by (n+).

Figure 3B:
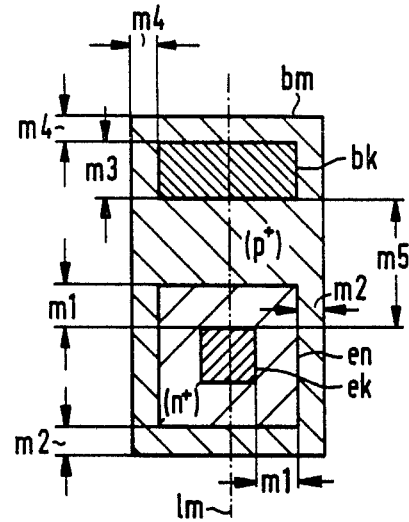

FIG. 3b shows the base element bm which contains only a single emitter subregion en. It is nearly equal to one half of the base subregion bn, and its layout is the same as the corresponding portions of the base subregion bn. The distance m4 between the edge of the base contact bk remote from the emitter and the adjacent short side of the base element bm is equal to the distance between the short side of the base contact bk and the adjacent long side of the base element bm. The effective base-emitter areas of the two base structures shown in FIGS. 3a and 3b thus have an integral ratio, namely two, so that they can be interconnected to form transistors with paired characteristics but different currents.

FIG. 4a shows schematically a transistor layout having subtransistors n1 connected in parallel in which the base structures are the base subregions bn as shown in FIG. 3a. Since negative feedback is to be applied to the transistor through an emitter resistor, the emitter subregions en of all subtransistors n1 each have one of the resistor regions rn connected in series therewith. The rectangular n+ resistor regions rn are formed in the same process step as the emitter subregions en. The base subregions bn are arranged side by side in the high-resistance n− collector region z1, with their long axes of symmetry ls running parallel to each other. The collector region z1 contains the base subregions bn, as is usual with transistors fabricated by planar technology, so that the base subregions bn are isolated from each other. Embedded in the collector region z1 at the edges thereof are n+ contact regions k3 which have interconnecting portions between adjacent base subregions bn. The contact regions k3 thus form rings around the base subregions bn, and are formed in the same process step as the resistor regions rn and the emitter subregions en. In FIG. 4a and subsequent figures, the n+ regions are indicated by wi-de diagonal hatching from the upper left to the lower right.

In the contact regions k3, collector contacts kk are formed along the long sides of the base subregions bn. Through their lateral arrangement, contact is made to the collector region z1 at many points without significantly increasing the area of the collector region. The resistor regions rn are arranged outside the collector region along the long axis of symmetry ls and contain a resistor contact wk at each of their short sides. The resistor regions rn are electrically isolated from each other and from the collector region z1, because each region is embedded in the lightly p-doped substrate s separately.

In FIG. 4a, the subtransistors n1 with negative feedback at their emitters are connected in parallel by five interconnections. The first interconnection f3 interconnects the base contacts bk of the base subregions bn. The second interconnection f4 interconnects all collector contacts kk on one side of the short axis of symmetry ks, and on the other side by the third interconnection f4'. Similarly, the fourth interconnection f5 interconnects all resistor contacts wk on one side of the short axis of symmetry ks which are remote from the subtransistors, and on the other side by the fifth interconnection f5'. The other contacts wk of the resistor regions are each connected to the associated emitter contact ek by an interconnection lv.

The interconnections f4, f4' cross the resistor regions rn and have lateral comblike extensions fs which are connected to the collector contacts kk. All collector contacts kk of the two halves of each contact bridge are connected to the extensions fs. The interconnections f4, f4' and the interconnections f5, f5' are connected together, respectively, outside the area of the arrangement shown in FIG. 4a.

FIG. 4b shows a section taken along line A—A of FIG. 4a. The resistor region rn and the collector region z1 in the p− substrate s are clearly shown as isolated from each other. It can also be seen how the base region bn and the contact region k3 are embedded in the collector region z1. The various regions are covered by the dotted insulation layer i, which has openings for making contact to the underlying regions.

The mutual isolation of the n− or n+ regions in the substrate s may be adversely affected by the formation of n conductivity type channels at the surface of the substrate s. This can be prevented by the simple means (not shown) of a p+ type channel stop region at the surface of the substrate s, because such a region interrupts a parasitic channel. The channel stop regions may be interconnected in a netlike manner and may fill up all those areas at the surfaces of the substrate s which are still "empty".

Figure 5B:
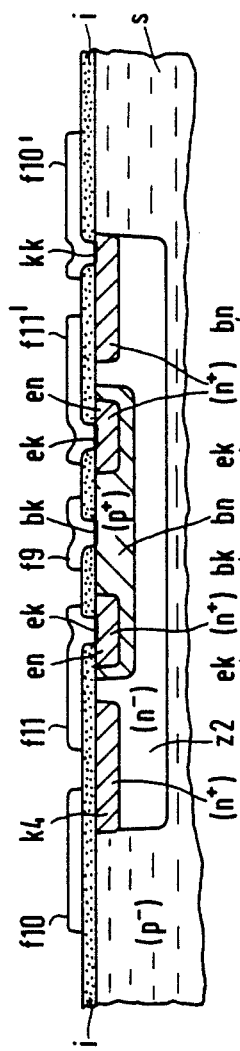
FIGS. 5a and 5b show a schematic layout in plan view and in sectional view, respectively, of another arrangement of transistors and negative-feedback resistors.
Figure 5A:
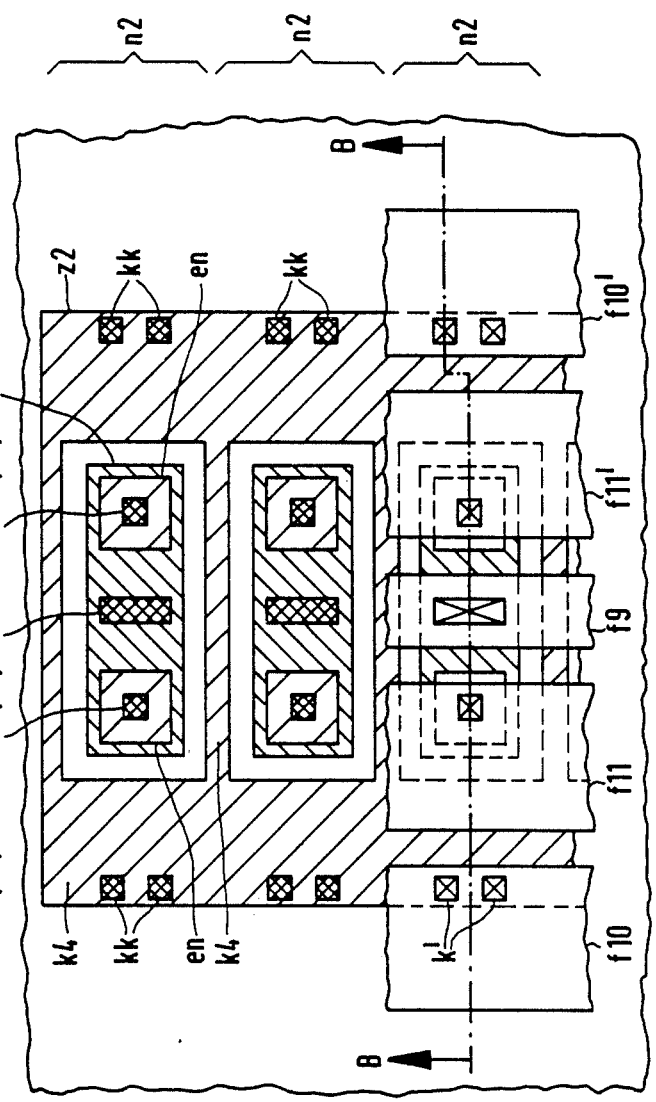
Figure 7:
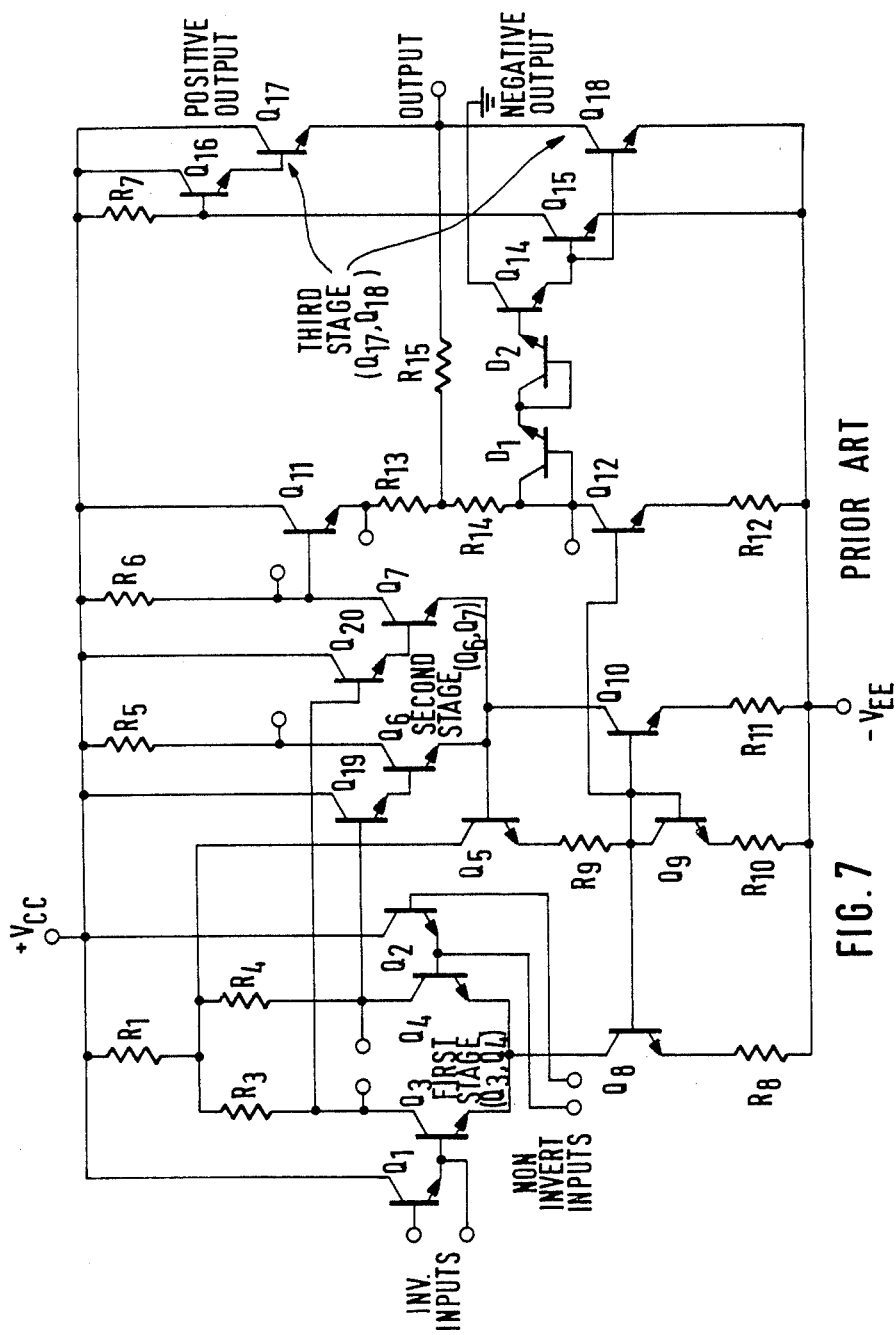
FIG. 7 is circuit diagram showing a conventional wideband power amplifier arrangement.

FIGS. 5a and 5b show a layout of parallel-connected subtransistors n2 which also contain the base subregions bn with dual emitters Unlike the arrangement in FIGS. 4a and 4b, the collector region z2 contains the collector contacts kk at the two short sides of the base subregions bn. The collector contacts kk are located within the collector contact region k4, which is formed in the collector region z2 at the edge thereof The bridge portions of the collector region z2 and the contact region k4 between the individual base subregions bn can be kept narrower than in FIG. 4a. However, the collector region z2 is clearly larger than in FIG. 4a in the direction of the long axis of symmetry ls because the common emitter leads f11, f11' are interposed between the common base lead f9 and the common collector leads f10, f10'.

In the case of the subtransistors n2 in FIG. 5a, no negative feedback is provided from the emitters This eliminates the need for the resistor regions rn, so that the leads f11, f11', which are comparable to the interconnections f5, f5' of FIG. 4a, now run along the emitter contacts ek and thus lie between the two leads f10, f10'. In FIG. 4a, the interconnections f5, f5' run outside the space between the interconnections f4, f4'. In FIG. 5a, the distance between the edge of the collector region z2 and the short sides of the base subregions bn is therefore greater than in FIG. 4a.

The minimum distances between the leads f10 and f11, f10' and f11', f9 and f11, and f9' and f11' follow from the above considerations, and the width of the emitter lead f11, f11' must be such that the voltage drop caused by the lead is negligible. The greater distance of the collector contacts kk from the base subregion bn is compensated for by the fact that the contact region f4 surrounds the base subregion bn as closely as possible, thus forming a low-resistance, broad stripe within the collector region z2 in the area of the collector contacts kk. This is illustrated in FIG. 5b, which is a schematic section taken along line B—B of FIG. 5a. As in FIG. 4b, the insulating layer i has openings for the various contacts. Also clearly visible is the broader collector region z2 with the likewise broadened contact region k4 in the area of the collector contacts kk.

FIGS. 6a and 6b show schematically a layout of parallel-connected additional subtransistors tm which have the base element bm of FIG. 3b as a base structure. The emitter subregions en of the base elements bm are connected by the interconnections lv to the resistor regions rn for providing negative feedback. The base elements bm lie side by side in the rectangular collector region z3, with their axes of symmetry lm running parallel to each other. The collector region z3 contains at its edge a low-resistance n+ contact region k5, which also forms interconnecting portions between the individual base elements bm. The collector contacts kk are arranged along the short side of the base element bm adjacent to the base contacts bk. To obtain a sufficient distance between the common base lead f6 and the common collector lead f7, the contact region k5 is somewhat broader in the area of the collector contacts than on the other short side of the base element bm.

FIG. 6b is a section taken along line C—C of FIG. 6a. The surface of the substrate is shown covered by the insulating layer i with openings therein where contact is to be made to underlying regions. In FIGS. 4–6, the contact areas k' in the areas of the interconnections are indicated as rectangles with diagonal lines.

A comparison between the subtransistors n1, n2, and tm shows that the subtransistors n1 of FIG. 4a have the smallest relative collector area. Due to the dual emitter structure, a transistor consisting of these subtransistors is suitable for large currents, and with the negative feedback resistor provided from the emitter, this transistor is preferably used for the second transistor t2 of the output stage p. Due to the voltage swing at tis collector, this transistor is especially sensitive to a Miller capacitance.

A transistor consisting of subtransistors n2 as shown in FIG. 5a is suitable for use as the first transistor t1 of the output stage p, in which it serves as an emitter follower. As this transistor has its collector connected to the fixed potential of the first supply line f1, no Miller capacitance can form.

Negative feedback resistors r3, r4 are used with the third and fourth transistors t3, t4, respectively, in the emitter leads, and these form part of the triple constant-current sink cs. Since the currents of the driver stage and the operating-point setter are considerably smaller than those of the output stage, the use of dual-emitter structures with their complex interconnections is not necessary. Therefore, the third and fourth transistors t3, t4 are suitably composed of the subtransistors tm as shown in FIG. 6a. The common base lead b of the triple constant-current sink cs is then formed by the interconnection f6, which is connected to the interconnection f3 to the base contacts for the transistor t2 having the structure in FIG. 4a. The second supply line f2 corresponds to the interconnections f5, f5' in FIG. 4a, and to the interconnection f8 in FIG. 6a, and may be connected to a common ground.

The transistor layout arrangements of FIGS. 3–6 offer the added advantage that the push-pull output stage gt with its large-area transistors, in particular, has a very compact layout, which permits precise pairing of the transistor characteristics without impairing the high-frequency performance of the transistors. Other subcircuits, such as the difference stage d and the constant-current sink g, in which the amplitude characteristics at high frequencies are less important, can contain PNP transistors or MOS transistors if the manufacturing process permits this and if the use of such transistors is appropriate for the operation of the circuit.

The specific embodiments of the invention described above are intended to be illustrative only, and many other variations and modifications may be made thereto in accordance with the principles of the invention. All such embodiments and variations and modifications thereof are considered to be within the scope of the invention, as defined in the following claims.

We claim:

1. A wideband power amplifier circuit comprising:
   a supply-voltage source having first and second supply lines;
   an output stage including first and second transistors connected in series in the same direction with a junction point provided as an output node in series between them, wherein a collector of the first transistor is coupled to the first supply line and the emitter of the second transistor is coupled to the second supply line;
   a driver stage including a third transistor having its base connected by a common base lead to the base of the second transistor and its collector connected to the base of the first transistor;
   a difference stage having input terminals to which an input voltage signal is applied and which provides an output difference signal; and
   an operating-point setter which is settable independently of the gain of the output stage and includes an intermediate node receiving the difference signal from the difference stage, a setting resistor connected between the first supply line and the intermediate node, a fourth transistor having its collector connected to the intermediate node in series with the setting resistor, its emitter connected to the second supply line, and its base connected to the common base lead, and a load-reducing transistor having its base connected to the intermediate node, its collector connected to the first supply line, and its emitter connected to the common base lead.

2. A wideband power amplifier circuit according to claim 1, further comprising a first resistor connected between the first supply line and a common junction point of the collector of the third transistor and the base of the first transistor.

3. A wideband power amplifier circuit according to claim 2, further comprising second, third, and fourth resistors each connected between an emitter of a respective one of said second, third, and fourth transistors and the second supply line and provide negative feedback from the respective emitter.

4. A wideband power amplifier circuit according to claim 3, wherein said second, third, and fourth transistors, said associated resistors, said intermediate node, and said load-reducing transistor together form a triple constant-current sink.

5. A wideband power amplifier circuit according to claim 3, wherein said circuit has a monolithic integrated circuit layout and said third transistor of said driver stage and said fourth transistor of said operating-point setter each comprises:
   (a) a plurality of subtransistors formed on a substrate, wherein each subtransistor has:
      (1) a rectangular base element of p+ conductivity type having a long axis of symmetry;
      (2) an emitter subregion of n+ conductivity type formed within said base element toward one side thereof in the direction of said long axis of symmetry and formed symmetrically with respect to said long axis of symmetry, and the emitter subregion having an emitter contact formed centrally therein; and
      (3) a base contact formed within said base element toward an opposite side thereof in the direction of said long axis of symmetry and formed symmetrically with respect to said long axis of symmetry;
   (b) a rectangular collector region of n− conductivity type within which said base elements of said plurality of subtransistors is arranged with their long axes of symmetry in parallel with each other;
   (c) said collector region having a contact region of n+ conductivity type encircling each base element;
   (d) each base element having at least one collector contact associated therewith formed on said contact region along a short side of the base element adjacent the base contact thereof.

6. A wideband power amplifier circuit according to claim 5, wherein said second, third, and fourth resistors associated with said second, third, and fourth transistors, respectively, each comprises:

a plurality of identical rectangular resistor regions of n+ conductivity type each connected to the emitter subregion of a respective one of said plurality of subtransistors, wherein the resistor regions extend parallel to each other in the direction of the long axes thereof, and each resistor region has one resistor contact connected to its associated emitter contact and another resistor contact connected to the second supply line of said supply-voltage source.

7. A wideband power amplifier circuit according to claim 1, further comprising a constant-current sink connected between the emitter of said load-reducing transistor and the second supply line.

8. A wideband power amplifier circuit according to claim 7, wherein said difference stage includes first and second input terminals, first and second voltage-to-current converters, each connected to a respective one of said input terminals, for converting potentials of said input voltage signal applied to said input terminals to first and second reference currents, and a current mirror receiving the first and second reference currents and outputting said difference signal as a difference current to said intermediate node of said operating-point setter.

9. A wideband power amplifier circuit according to claim 8, wherein said first and second voltage-to-current converters include respective impedance converters in the form of fifth and sixth transistors having their collectors connected to the first supply line, their bases connected to said first and second input terminals, and their emitters connected to fifth and sixth resistors, respectively.

10. A wideband power amplifier circuit according to claim 9, wherein said current mirror includes a seventh transistor and an eighth transistor having their bases connected together and to the collector of the seventh transistor, and their emitters connected to said common base lead.

11. A wideband power amplifier circuit according to claim 10, wherein said fifth, sixth, seventh, and eighth transistors are of the same conductivity type as said transistors of said output stage.

12. A wideband power amplifier circuit according to claim 8, wherein a load current is drawn from said common base lead and is set by a value of said constant-current sink selected such that a current through said load-reducing transistor is equal to said first reference current provided from said first voltage-to-output converter.

13. A wideband power amplifier circuit according to claim 1, wherein said setting resistor is selected and said operating-point setter operates such that only a setting current through said setting resistor determines the the quiescent output voltage at the output node, so that the ratio of the quiescent voltage to said supply-voltage source is independent of temperature and of the supply voltage.

14. A wideband power amplifier circuit according to claim 1, wherein the output voltage at the output node is proportional to the input voltage signal applied to the input terminals, so that the swing of the output voltage is independent of temperature.

15. A wideband power amplifier circuit according to claim 1, wherein said circuit has a monolithic integrated circuit layout and said first and second transistors of said output stage each comprises:

(a) a plurality of subtransistors formed on a substrate, wherein each subtransistor has:
  (1) a rectangular base subregion of p+ conductivity type having a long axis of symmetry and a short axis of symmetry;
  (2) two identical emitter subregions of n+ conductivity type formed within said base subregion symmetrically with respect to said long axis of symmetry and spaced apart symmetrically on each side of said short axis of symmetry, and the emitter subregion having an emitter contact formed centrally therein; and
  (3) a base contact positioned between said two emitter subregions on said short axis of symmetry;

(b) a rectangular collector region of n− conductivity type within which said base subregions of said plurality of subtransistors are arranged lying side by side with their long axes of symmetry parallel to each other;

(c) said collector region having a contact region of n+ conductivity type encircling each base subregion and extending between the long sides of adjacent base subregions;

(d) a plurality of collector contacts formed on said contact regions on opposite sides of the base subregions symmetrically with respect to one of said axes of symmetry.

16. An integrated circuit layout for a bipolar NPN transistor of a wideband power amplifier comprising:

(a) a plurality of subtransistors formed on a substrate, wherein each subtransistor has:
  (1) a rectangular base subregion of p+ conductivity type having a long axis of symmetry and a short axis of symmetry;
  (2) two identical emitter subregions of n+ conductivity type formed within said base subregion symmetrically with respect to said long axis of symmetry and spaced apart symmetrically on each side of said short axis of symmetry, and each emitter subregion having an emitter contact formed centrally therein; and
  (3) a base contact positioned between said two emitter subregions on said short axis of symmetry;

(b) a rectangular collector region of n− conductivity type within which said base subregions of said plurality of subtransistors are arranged lying side by side with their long axes of symmetry parallel to each other;

(c) said collector region having a contact region of n+ conductivity type encircling each base subregion and extending between the long sides of adjacent base subregions;

(d) a plurality of collector contacts formed on said contact regions on opposite sides of the base subregions symmetrically with respect to one of said axes of symmetry.

17. An integrated circuit layout for a bipolar NPN transistor of a wideband power amplifier comprising:

(a) at least one subtransistor formed on a substrate, wherein said at least one subtransistor has:
  (1) a rectangular base element of p+ conductivity type having a long axis of symmetry;
  (2) an emitter subregion of n+ conductivity type formed within said base element toward one side thereof in the direction of said long axis of symmetry and formed symmetrically with respect to said long axis of symmetry, and each emitter subregion having an emitter contact formed centrally therein; and (3) a base contact formed within said base element toward an opposite side thereof in the direction of said long axis of symmetry and formed symmetrically with respect to said long axis of symmetry;

(b) a rectangular collector region of n− conductivity type within which each base element of said at least one subtransistor is arranged with its long axis of symmetry in parallel;

(c) said collector region having a contact region of n+ conductivity type encircling each base element;

(d) each base element having at least one collector contact associated therewith formed on said contact region along a short side of the base element adjacent the base contact thereof.

* * * * *